United States Patent
Woods et al.

(10) Patent No.: US 9,634,175 B2
(45) Date of Patent: Apr. 25, 2017

(54) SYSTEMS AND METHODS FOR THERMALLY MANAGING HIGH-TEMPERATURE PROCESSES ON TEMPERATURE SENSITIVE SUBSTRATES

(71) Applicant: Ascent Solar Technologies, Inc., Thornton, CO (US)

(72) Inventors: Lawrence M. Woods, Littleton, CO (US); Rosine Ribelin, Lakewood, CO (US); Joseph H. Armstrong, Littleton, CO (US)

(73) Assignee: ASCENT SOLAR TECHNOLOGIES, INC., Thornton, CO (US)

( * ) Notice: Subject to any disclaimer, the term of this patent is extended or adjusted under 35 U.S.C. 154(b) by 311 days.

(21) Appl. No.: 14/150,376

(22) Filed: Jan. 8, 2014

(65) Prior Publication Data

US 2014/0193942 A1  Jul. 10, 2014

Related U.S. Application Data

(60) Provisional application No. 61/750,709, filed on Jan. 9, 2013.

(51) Int. Cl.
*H01L 31/18* (2006.01)
*H01L 31/032* (2006.01)
(Continued)

(52) U.S. Cl.
CPC .......... *H01L 31/18* (2013.01); *C23C 14/0021* (2013.01); *C23C 14/20* (2013.01);
(Continued)

(58) Field of Classification Search
None
See application file for complete search history.

(56) References Cited

U.S. PATENT DOCUMENTS

| 8,021,905 B1 | 9/2011 | Nath et al. |
| 2008/0128013 A1* | 6/2008 | Lopatin ............ C25D 5/022 136/244 |

(Continued)

FOREIGN PATENT DOCUMENTS

| CN | 1856863 A | 11/2006 |
| CN | 1943015 A | 4/2007 |

OTHER PUBLICATIONS

Kawamura, M., et al. "Cu(InGa)Se2 Thin-Film Solar Cells Grown With Cracked Selenium," Journal of Crystal Growth, vol. 311, pp. 753-756, Jan. 15, 2009.

(Continued)

*Primary Examiner* — Nathan T Leong
(74) *Attorney, Agent, or Firm* — Lathrop & Gage LLP

(57) ABSTRACT

A method for depositing one or more thin-film layers on a flexible polyimide substrate having opposing front and back outer surfaces includes the following steps: (a) heating the flexible polyimide substrate such that a temperature of the front outer surface of the flexible polyimide substrate is higher than a temperature of the back outer surface of the flexible polyimide substrate, and (b) depositing the one or more thin-film layers on the front outer surface of the flexible polyimide substrate. A deposition zone for executing the method includes (a) one of more physical vapor deposition sources adapted to deposit one or more metallic materials on the front outer surface of the substrate, and (b) one or more radiant zone boundary heaters.

15 Claims, 5 Drawing Sheets

(51) Int. Cl.
*H01L 31/0392* (2006.01)
*H01L 21/67* (2006.01)
*C23C 14/00* (2006.01)
*C23C 14/20* (2006.01)
*C23C 14/54* (2006.01)
*H01L 21/02* (2006.01)

(52) U.S. Cl.
CPC ...... *C23C 14/541* (2013.01); *H01L 21/67115* (2013.01); *H01L 31/0322* (2013.01); *H01L 31/03928* (2013.01); *H01L 21/02422* (2013.01); *H01L 21/02568* (2013.01); *Y02E 10/541* (2013.01)

(56) References Cited

U.S. PATENT DOCUMENTS

| | | |
|---|---|---|
| 2008/0230180 A1 | 9/2008 | Yoneda et al. |
| 2008/0314439 A1 | 12/2008 | Misra |
| 2011/0002674 A1 | 1/2011 | Shimizu et al. |
| 2011/0120557 A1 | 5/2011 | Suh et al. |
| 2011/0168243 A1* | 7/2011 | Elowe ............... H01L 31/02167 136/255 |

OTHER PUBLICATIONS

Schmid, U., et al. "Characterization of Aluminium Nitride and Aluminium Oxide Thin Films Sputter-Deposited on Organic Sputter-Deposited on Organic Substrates," Microsyst Technol, 14:483-490, 2008.

Chinese Patent Application No. 201480004408.4, First Office Action dated Aug. 17, 2016.

Supplementary European Search Report dated Aug. 1, 2016, for European Application No. 14738271.7 (6 pages).

* cited by examiner

SYSTEMS AND METHODS FOR THERMALLY MANAGING HIGH-TEMPERATURE PROCESSES ON TEMPERATURE SENSITIVE SUBSTRATES

CROSS-REFERENCE TO RELATED APPLICATIONS

This application claims benefit of priority to U.S. Provisional Patent Application Ser. No. 61/750,709, filed Jan. 9, 2013, which is incorporated herein by reference.

BACKGROUND

Photovoltaic devices generate an electric current in response to incident light. One class of photovoltaic devices commonly used today is based on crystalline silicon solar absorber layers. Crystalline silicon photovoltaic devices include, for example, thick silicon wafers. These wafers are fragile and cannot be bent without risk of damage, and therefore, the wafers must be disposed on a rigid substrate, such as a large-area rigid glass substrate. Although crystalline silicon photovoltaic devices may achieve relatively high efficiencies, they are typically expensive and heavy. Additionally, their inflexibility prohibits their use in non-planar applications, or in applications subject to bending. Furthermore, their weight prohibits some roof top applications.

Accordingly, there is great interest in developing "thin-film" photovoltaic devices, which are potentially thinner, lighter, and cheaper than crystalline silicon photovoltaic devices. Additionally, a thin-film photovoltaic device will typically tolerate at least some flexing, potentially allowing use of a flexible substrate, so that the photovoltaic device is flexible. A flexible photovoltaic device may advantageously conform to non-planar surfaces and/or be used in applications subject to bend flexing.

FIG. 1 shows a cross-sectional view of a conventional thin-film photovoltaic device 100, which includes a thin-film stack 102 disposed on a substrate 104. Photovoltaic stack 102 includes a first electrical contact layer 106, such as a Molybdenum layer, disposed on a first or front outer surface 108 of substrate 104. A solar absorber layer 110 is disposed on first electrical contact layer 106, and a heterojunction partner layer 112 is disposed on solar absorber layer 110. A second electrical contact layer 114, such as a conductive oxide layer, is typically disposed on heterojunction partner layer 112. Solar absorber layer 110 and heterojunction partner layer 112 collectively form a P-N photovoltaic junction, which generates an electric current in response to incident light. First and second electrical contact layers 106, 114 provide an electrical interface to the photovoltaic junction. Some examples of possible solar absorber layer materials include Selenium-based chalcogenides such as Copper-Indium-DiSelenide (CIS), or an alloy thereof. Some examples of CIS alloys include Copper-Indium-Gallium-DiSelenide (CIGS), Silver-Copper-Indium-Gallium-DiSelenide (AgCIGS), and Copper-Indium-Gallium-Aluminum-DiSelenide (CIGAS). Replacing or alloying selenium in the solar absorber with other group VI elements, such as Sulfur or Tellurium, is also attractive in certain applications. Some examples of possible heterojunction partner layer materials include Cadmium Sulfide, metal oxides, or alloys thereof. Additional layers, such as buffer layers and/or stress relief layers, are often added to photovoltaic device 100. For example, a metallic layer, such as a Molybdenum layer 118, is sometimes disposed on back outer surface 116 of substrate 104 to provide stress relief and dissipate static electricity.

Many photovoltaic devices include a plurality of photovoltaic cells electrically coupled in series and/or parallel to meet an application's voltage and/or current requirements. It is often desirable that the plurality of photovoltaic cells be monolithically integrated on a common substrate. Monolithic integration can enable customization of device output voltage and output current ratings during device design, thereby allowing the device to be tailored to its intended application. Additionally, monolithic integration promotes small device size and pleasing aesthetic properties by reducing pitch between adjacent photovoltaic cells, as well by reducing or eliminating use of discrete bus bars to connect adjacent cells, relative to non-monolithically integrated photovoltaic devices.

Monolithic integration requires, though, that an outer surface of the device substrate, such as outer surface 108 of substrate 104 (FIG. 1), be dielectric. Specifically, the surface must be dielectric to allow electrical separation of adjacent photovoltaic cells by cell isolation scribes, which are sometimes referred to as "P1" scribes. If the substrate outer surface were instead conductive, or if the P1 scribe penetrated a surface dielectric to a conductive substrate, then adjacent photovoltaic cells would electrically short together, thereby rendering the P1 scribes ineffective. Some examples of monolithic integration techniques including use of cell isolation scribes are disclosed in U.S. Patent Application Publication Number 2008/0314439 to Misra, which is incorporated herein by reference.

A dielectric surface may be obtained on a conductive flexible substrate, such as metallic foil, by applying a dielectric coating to the substrate. However, this procedure may be difficult to implement because the dielectric coating must be free of defects, such as pinholes, to prevent photovoltaic cell electrical shorting. Additionally, the dielectric coating is prone to damage during thin-film deposition on the substrate, as well as during the monolithic integration patterning process.

Alternately, a dielectric substrate may be used with monolithic integration. However, few flexible substrate materials are both dielectric and able to withstand high temperature processing associated with thin-film layer deposition. One possible flexible dielectric substrate material is flexible glass. However, flexible glass substrates are still in their developmental stage and are not available for use in high volume production applications. Another flexible dielectric substrate material is polyimide. Thin polyimide substrates are widely available and some formulations can often survive processing temperatures of up to 450 degrees Celsius for short periods of time, such as for 30 minutes or less.

FIG. 2 illustrates a prior art CIGS deposition zone 200 adapted to form a CIGS solar absorber layer on a flexible polyimide substrate 202 having a thickness 230 and opposing front and back outer surfaces 218, 228, respectively. Substrate 202 has been prepped with an electrical contact layer (not shown) on front outer surface 218, where the contact layer is analogous to layer 106 of FIG. 1. A stress relief layer (not shown) analogous to layer 118 of FIG. 1 is optionally disposed on back outer surface 228. Deposition zone 200 includes a plurality of sources that respectively emit metallic plumes 212, 214, 216 that are subsequently disposed in front 210 of substrate 202. In this system, three sources 204, 206, and 208 dispose metallic elements onto front outer surface 218 of substrate 202; these elements typically include one or more of Copper, Indium, and Gallium. A Selenium manifold 220 provides Selenium vapor 222 to deposition zone 200 in front 210 of substrate 202. Substrate heaters 224, which are disposed behind 226 substrate 202, provide radiant heat to back outer surface 228 of substrate 202. A zone enclosure and vacuum pump (not shown) maintain a vacuum in deposition zone 200. Copper, Indium, and Gallium emitted from sources 204, 206, 208 onto front outer surface 218 of substrate 202 collectively react in the presence of Selenium vapor 222 to form a precursor of, or the entirety of, a CIGS layer on substrate front outer surface 218, given a proper thermodynamic environment.

Metallic sources 204, 206, 208 provide some heat to front outer surface 218. Furthermore, additional heaters (not shown) are sometimes disposed in front 210 of substrate 202 to enhance early deposition run stability and to prevent elements from condensing and re-evaporating. These additional heaters, if present, will also somewhat heat front outer surface 218. However, substrate heaters 224, which heat substrate back outer surface 228, provide the majority of thermal energy necessary to enable CIGS deposition. Substrate heaters 224 may require different set points relative to one another to achieve the desired substrate 202 temperature, due to different levels of heating provided by sources 204, 206, and 208. As known in the art, CIS/CIGS deposition requires high substrate temperatures, and photovoltaic device efficiency is often dependent on substrate temperature. For example, substrate temperatures in excess of 500 degrees Celsius are typically required to obtain highest efficiency CIS/CIGS photovoltaic devices. Additionally, studies have shown potential advantages of increasing the Se thermal energy during thin-film deposition, such as by using a Se furnace or cracker, to reduce the Se evaporant cluster size during the co-evaporated CIGS process. (See, e.g., M. Kawamura et al., "Cu(InGa)Se2 thin-film solar cells grown with cracked selenium," Journal of Crystal Growth, vol. 311, Jan. 15, 2009, pp. 753-756). While rigid glass substrates are durable to these temperatures, flexible polyimide substrates degrade at elevated temperatures, thereby limiting CIS/CIGS deposition processes on polyimide substrates. Additionally, polyimide substrates are highly susceptible to absorbing water vapor, which can subsequently be released when heated during CIS/CIGS fabrication. Unless extreme care is taken to ensure that polyimide substrates are properly degassed prior to electrical contact layer deposition, moisture may be trapped under the first electrical contact layer during substrate heating, potentially leading to PV device cracking and blistering. Cracking and blistering may dramatically impair photovoltaic device performance and/or manufacturing yield.

SUMMARY

In an embodiment, a method for depositing one or more thin-film layers on a flexible polyimide substrate having opposing front and back outer surfaces includes the following steps: (a) heating the flexible polyimide substrate such that a temperature of the front outer surface of the flexible polyimide substrate is higher than a temperature of the back outer surface of the flexible polyimide substrate; and (b) depositing the one or more thin-film layers on the front outer surface of the flexible polyimide substrate.

In an embodiment, a deposition zone for depositing a material on a substrate, where the substrate has a first outer surface of depth by width, includes the following: (a) one of more physical vapor deposition sources adapted to deposit one or more metallic materials on the first outer surface of the substrate; and (b) one or more radiant zone boundary heaters. Each radiant zone boundary heater includes an outer heating surface adapted to emit infrared radiation, and at least one outer heating surface is angularly displaced from the first outer surface of the substrate by an angle of less than ninety degrees. Each outer heating surface is in line of sight with at least part of the first outer surface of the substrate.

DETAILED DESCRIPTION OF THE EMBODIMENTS

As discussed above, conventional systems for depositing CIS/CIGS on a polyimide substrate include substrate heaters adapted to radiantly heat the substrate's back outer surface, while deposition equipment deposits CIS/CIGS on the front outer surface. The reasons that conventional systems employ back outer surface heating are twofold: (1) it was conventionally thought that back surface heating was necessary to achieve uniform heating for robust CIS/CIGS deposition, and (2) back surface heating allows substrate heaters to be disposed outside of the paths of CIS/CIGS sources.

Figure 1:
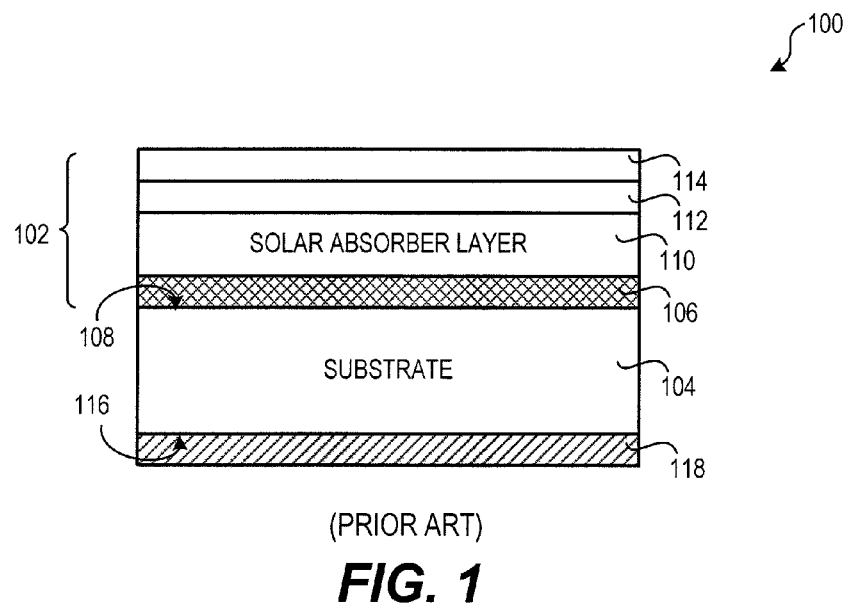
FIG. 1 shows a cross-sectional view of a prior art thin-film photovoltaic device.
Figure 2:
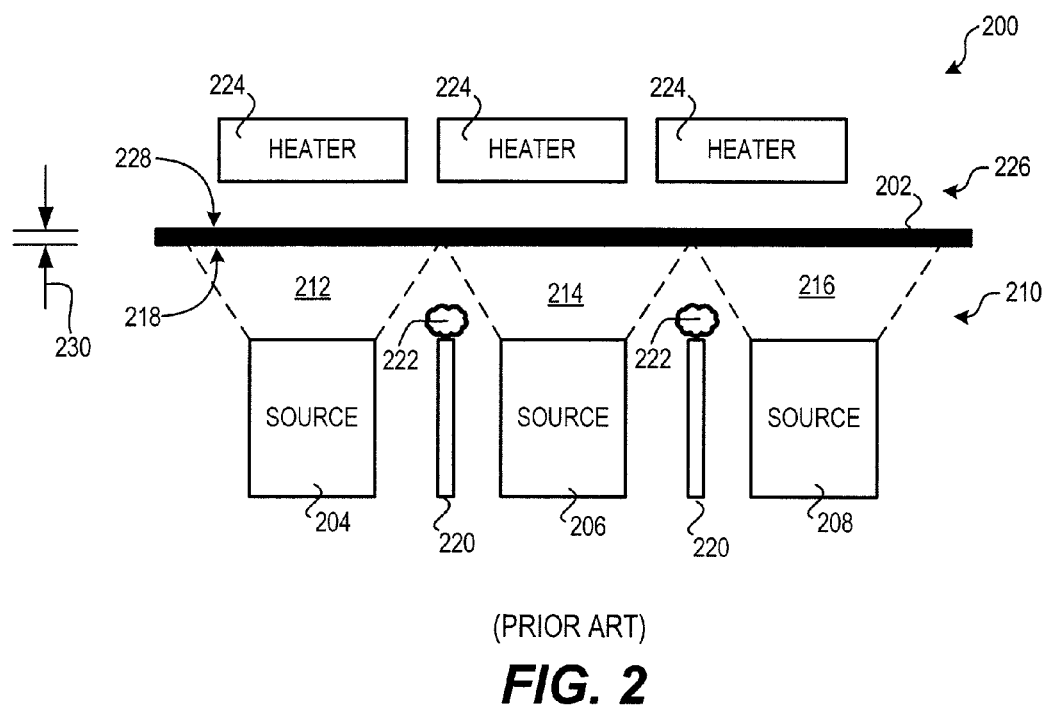
FIG. 2 illustrates a prior art CIGS deposition system.

However, Applicants' thermal modeling indicates that there is a small, but not insignificant, thermal gradient across the substrate's thickness, during typical CIS/CIGS deposition. For example, heating applied to the back outer surface 228 side of substrate 202 leads to a small (e.g., 3-7° C.) thermal gradient across the substrate's thickness 230, when a contact layer is disposed on front outer surface 218 (see FIG. 2). Thus, substrate front outer surface 218 is slightly cooler than back outer surface 228 under these conditions. This thermal gradient can be more or less significant, depending on the quality of the contact between the coating and the substrate. A front-to-back temperature gradient is not a problem with conventional glass substrates or metallic substrates, the latter with presumable little or no gradient, because substrate heaters can be adjusted to achieve sufficient heat on the substrate's front outer surface as needed for reacting high quality CIS/CIGS without damaging the substrate. However for temperature limited substrates such as polyimide, or possibly thin glass, the substrate heaters cannot be adjusted higher than the substrate temperature limit, thereby potentially leading to less heat to the front outer surface for reacting high quality CIS/CIGS. Thus, for a 5° C. thermal gradient across the substrate thickness, applying heat to the substrate front side would result in a 10° C. lower back side temperature to achieve the same front side temperature when compared to back side heating.

Figure 3:
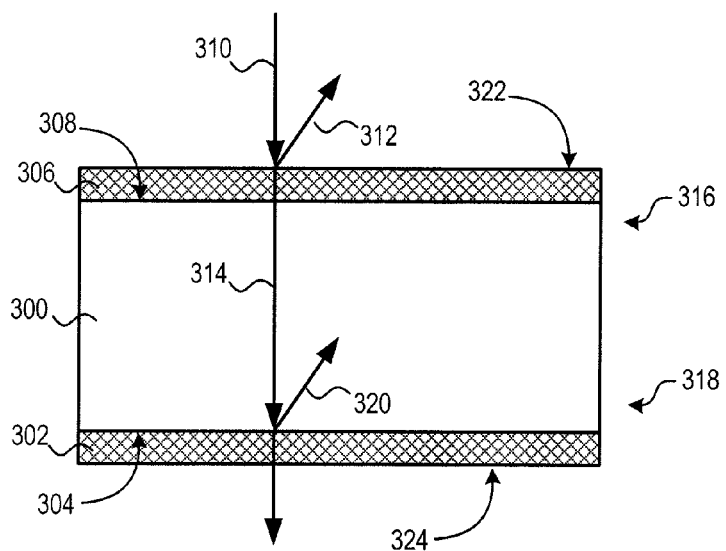
FIG. 3 illustrates one example of how heat can get trapped in a polyimide substrate.

Applicants have determined that the thermal gradient during CIS/CIGS deposition can be attributed to a combination of the insulating properties of the polyimide substrate, a heat reflective front side metallic layer, and process driven active radiative heating and cooling in the vacuum chamber. For example, FIG. 3 shows a cross sectional view of a polyimide substrate 300 including a front metallic layer 302 on its front outer surface 304 and a back side metallic layer 306 on its back outer surface 308. Heat is transferred to and from substrate 300 during CIS/CIGS deposition primarily by radiation, since the deposition is performed in a vacuum.

Consider the scenario where back outer surface 308 is heated by radiation 310 impinging outer surface 322 of back side metallic layer 306. A portion 312 of radiation 310 is reflected away by back side metallic layer 306, while a portion 314 of radiation 310 is transmitted through back side metallic layer 306 and is partially absorbed by the substrate 300. Due to the relatively low thermal conductivity of substrate 300, heat conducts relatively slowly through substrate 300, such that the back 316 of substrate 300 is warmer than the front 318 of the substrate, aided by heat radiation away from front contact 302 to the cooler chamber ambient, despite some incident heat radiation from the hot sources. Additionally, some of radiation 314 that is not absorbed by substrate 300 is reflected by front metallic layer 302 back into substrate 300, as indicated by arrow 320, which further heats substrate 300. Similarly, when no back side metal is used, primary radiation from the back side heaters and reflected radiation from the back of front metallic layer 302 result in substrate heating. In either case, front outer surface 324 is radiatively cooled because its view is of mostly cooler surfaces.

Accordingly, Applicants have determined that it is better to heat a polyimide substrate's front outer surface, instead of its back outer surface, when depositing CIS/CIGS on the front outer surface. For example, heating the front outer surface potentially allows heating radiation to be substantially confined to the substrate front side where CIS/CIGS deposition occurs, thereby providing the necessary energy to support CIS/CIGS reaction, without excessively heating the entire substrate as required using conventional techniques. This ability to avoid excessive substrate heating while enhancing the CIS/CIGS reaction promotes device reliability and high manufacturing yield by reducing substrate degradation. Furthermore, heating the substrate's front outer surface may provide sufficient thermal energy to achieve small Se evaporant cluster size during a co-evaporated CIGS deposition process, without requiring use of a Se furnace or cracker.

Figure 4:
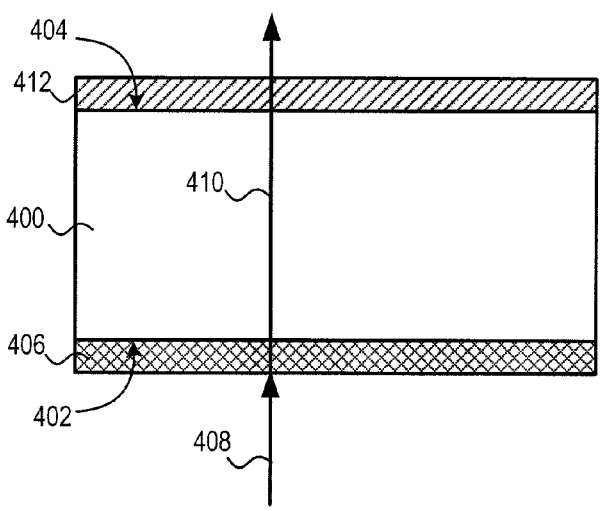
FIG. 4 illustrates one example of how substrate heating can be minimized by promoting radiation of heat from the substrate's back outer surface.

Applicants have also discovered that polyimide substrate heating can be further minimized during CIS/CIGS deposition on the front outer surface by promoting radiant emission of heat from the back outer surface. FIG. 4 shows a cross-sectional view of a polyimide substrate 400 having opposing front and back outer surfaces 402, 404. A front metallic layer 406, such as a Molybdenum layer, is disposed on front outer surface 402. Assume that substrate 400 is heated by radiation 408 impinging on front metallic layer 406. A portion 410 of the radiation will flow through front metallic layer 406 into substrate 400, along with some conducted heat flow. It is desirable that heat radiation 410 exit back outer surface 404 to prevent the radiation 410 from being trapped inside substrate 400, thereby helping minimize substrate heating. As discussed above, excessive substrate heating can cause a number of undesired effects, and it is therefore desirable to minimize substrate heating.

Figure 5:
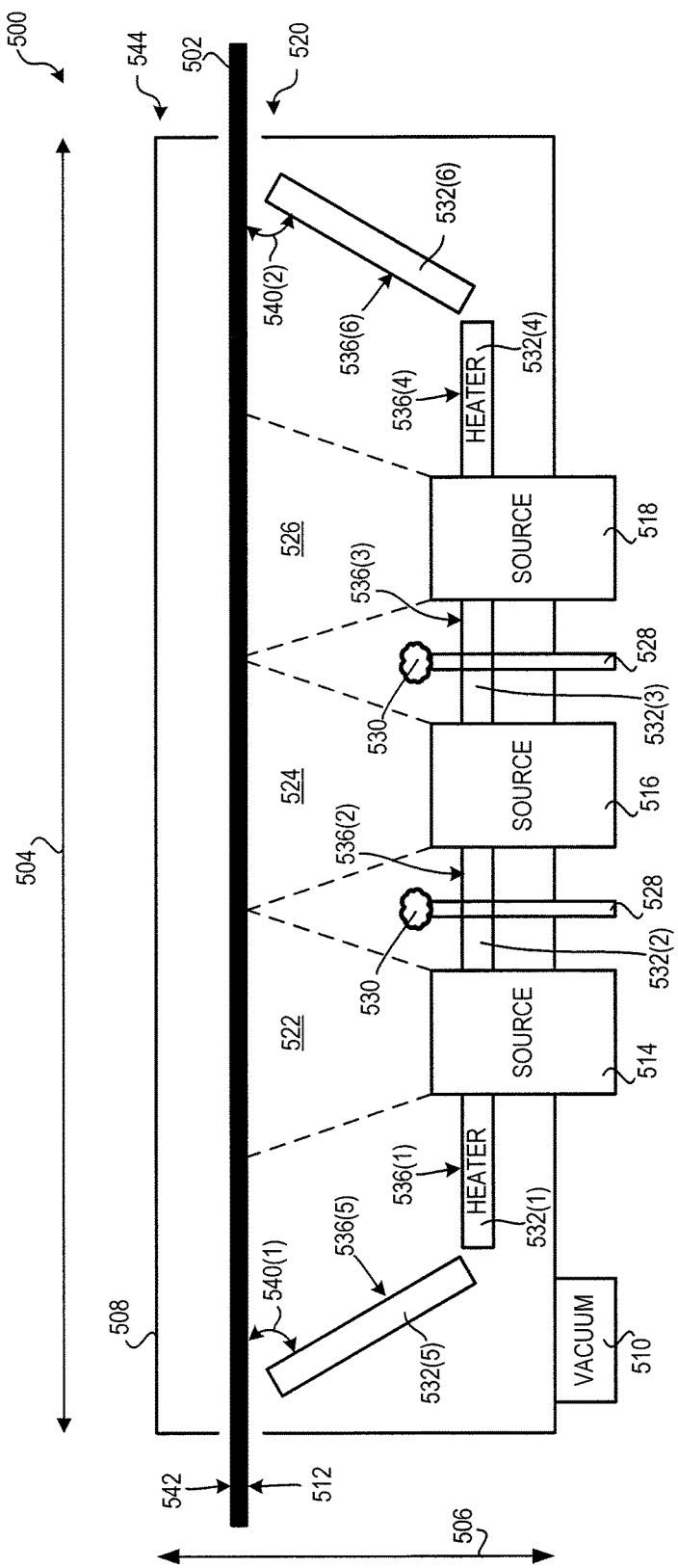
FIG. 5 illustrates one CIGS deposition zone including heaters adapted to radiantly heat a front outer surface of a substrate, according to an embodiment.

With respect to FIG. 4, a back metallic layer reflects heat from the substrate and front metallic layer back into the substrate, thereby impeding radiation of heat away from the substrate. Such impediment can be removed by either omitting the back metallic coating, or by using an infrared transparent coating 412 as a stress matching layer in place of the back metallic coating. Additionally, heat radiance away from the substrate can be promoted by making the transparent coating 412 a high emittance coating. In some embodiments, the high emittance coating is a dielectric coating to reduce the risk of undesired electrical shorting of photovoltaic cells. Some examples of high emittance coatings include transparent oxides and optically-transparent nitrides, such as $Al_2O_3$, $SiO_x$. These materials typically achieve infrared transmission and high emittance, with minimal absorption and low conductivity FIG. 5 illustrates one CIGS deposition zone 500 adapted to deposit CIGS on a flexible, polyimide substrate 502. Deposition zone 500 has a length 504, a height 506, and a width (not labeled) perpendicular to the length and height directions. Deposition zone 500 includes an enclosure 508 and a vacuum pump 510 that collectively form a vacuum chamber adapted to maintain a vacuum inside enclosure 508. A substrate handling apparatus (not shown) internal and/or external to zone 500, such as pay-out and take-up spools and substrate supporting rollers, supports substrate 502 within zone 500 such that a front outer surface 512 of substrate 502 is substantially disposed in the length by width directions. In some embodiments, the substrate handling apparatus is also capable of translating substrate 502 through zone 500 in the length 504 direction.

Deposition zone 500 includes a plurality of physical vapor deposition sources adapted to deposit metallic materials; in this embodiment, three sources 514, 516, and 518 are illustrated. These sources provide, for example, Copper, Indium, and Gallium, as well as other elements necessary to produce a desired semiconductor compound in zone 500. Physical vapor deposition sources 514, 516, 518 are disposed in front 520 of substrate 502 and are adapted to emit metallic plumes 522, 524, and 526 representing at least some of the elements required to produce the desired semiconductor compound. For example, in some embodiments, physical vapor deposition sources 514, 516, and 518 dispose Copper, Indium, and Gallium, respectively, on front outer surface 512 of substrate 502. A Selenium manifold 528 is typically included to provide Selenium vapor 530 to deposition zone 500.

Deposition zone 500 further includes one or more radiant zone boundary heaters 532. In this document, specific instances of an item may be referred to by use of a numeral in parentheses (e.g., heater 532(1)) while numerals without parentheses refer to any such item (e.g., heaters 532). Each radiant zone boundary heater 532 has a respective outer heating surface 536 adapted to emit infrared radiation for radiant heating. Outer heating surfaces 536 are in line of sight with at least part of substrate outer surface 512. In some embodiments, heaters 532 are electric radiant heaters. Radiant zone boundary heaters 532(1)-532(4) are placed such that their respective heating surfaces 536 are disposed substantially in the length by width directions, such that the heating surfaces have a high view factor with at least part of substrate front outer surface 512. In the context of this document, view factor of a first surface to a second surface is the ratio of (i) radiation leaving the first surface which strikes the second surface to (ii) the total radiation leaving the first surface. For example, the view factor of heating surface 536(1) to substrate outer surface 512 is the ratio of (i) infrared radiation leaving surface 536(1) and striking substrate surface 512 to (ii) total infrared radiation leaving heating surface 536(1). Radiant zone boundary heaters 532(5) and 532(6), on the other hand, are placed such that their respective heating surfaces 536 are angularly displaced from substrate front outer surface 512 by a respective angle 540 that is less than ninety degrees, such as forty-five degrees. Such placement of heaters 532(5), 532(6) results in their respective heating surfaces 536 having a higher view factor to the substrate outer surface 512 than would be achieved if the heaters were disposed with their heating surfaces perpendicular to the plane of outer surface 512. Disposing heaters such that they have high view factors to the substrate front outer surface 512 enables direct radiant heating of front outer surface 512, such that a temperature of front outer surface 512 is higher than the temperature of a back outer surface 542 of substrate 502. Heat from physical vapor deposition sources 514, 516, 518 will also typically directly heat front outer surface 512 such that these sources and zone boundary heaters 532 collectively provide the necessary thermal energy such that Copper, Indium, and Gallium react with Selenium at front outer surface 512 to form CIGS.

It is anticipated that additional deposition zones will typically be used in conjunction with deposition zone 500, where each additional deposition zone deposits one or more additional thin-film layers on substrate 502, such that the deposited thin-film layers collectively form a thin-film stack on substrate 502. For example, an additional deposition zone may be positioned upstream from zone 500 to deposit an electrical contact layer on substrate front outer surface 512 before substrate 502 enters zone 500. As another example, an additional deposition zone may be positioned downstream from zone 500 to deposit a heterojunction partner layer on the CIGS layer deposited in zone 500, such that the CIGS layer and heterojunction partner layer collectively form a P-N photovoltaic junction. Furthermore, multiple instances of deposition zone 500 are optionally employed to deposit multiple CIGS sublayers on substrate 502, such as by using techniques disclosed in U.S. Pat. No. 8,021,905 to Nath et al. Moreover, although deposition zone 500 is shown having a respective enclosure 508 and vacuum pump 510, in some alternate embodiments, zone 500 shares an enclosure and/or vacuum pump with one or more other deposition zones.

Figure 6:
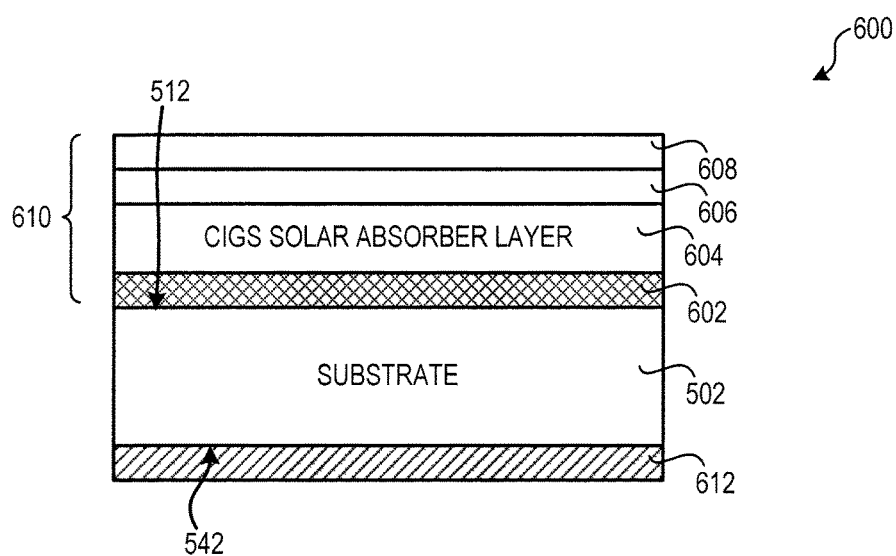
FIG. 6 shows a cross-sectional view of a photovoltaic device including a CIGS solar absorber layer formed by the deposition zone of FIG. 5, according to an embodiment.

FIG. 6 shows a cross-sectional view of a photovoltaic device 600, which is one example of a photovoltaic device including a CIGS layer formed by deposition zone 500. Deposition zone 500, however, is not limited to forming the CIGS layer of photovoltaic device 600. Photovoltaic device 600 includes a first electrical contact layer 602 formed on substrate front outer surface 512, a CIGS solar absorber layer 604 formed by deposition zone 500 on contact layer 602, a heterojunction partner layer 606 formed on solar absorber layer 604, and a second electrical contact layer 608 formed on heterojunction partner layer 606. Layers 602, 604, 606, 608 collectively form a thin-film stack 610 on front outer surface 512. Solar absorber layer 604 and heterojunction partner layer 606 collectively form a P-N junction, which generates electron-hole pairs in response to incident light. Photovoltaic device 600 optionally further includes a high emittance oxide layer 612 formed on substrate back outer surface 542, to facilitate radiation of heat from back outer surface 542 when forming one or more layers of stack 610. Additional layers, such as buffer layers and/or stress relief layers, may be added to photovoltaic device 600 without departing from the scope hereof.

Although deposition zone 500 is shown as being adapted to deposit CIGS on substrate 502, zone 500 could be modified to deposit CIS, another alloy of CIS, or even a material other than CIS/CIGS that requires high deposition temperatures on temperature limiting substrates, without departing from the scope hereof. Additionally, although deposition zone 500 is shown as configured such that only substrate front outer surface 512 is directly radiantly heated, it should be understood that zone 500 could be modified to additionally include heaters behind 544 substrate 502 which are adapted to radiantly back outer surface 542 of substrate 502. However, if back surface heaters are employed, deposition zone 500 should be configured so that radiant heat generating elements directly radiantly heating front outer surface 512, such as zone boundary heaters 532 and physical vapor deposition sources 514, 516, 518, provide most of the thermal energy required for CIS/CIGS reaction on substrate 502, to realize the advantages associated with front outer surface heating discussed above. In an alternate embodiment, deposition zone 500 further includes substrate chillers (not shown) disposed behind 544 substrate 502 to enhance radiative heat transfer from substrate back outer surface 542, thereby enabling a greater front outer surface 512 temperature, while protecting substrate 502 from excessive heat buildup.

Figure 7:
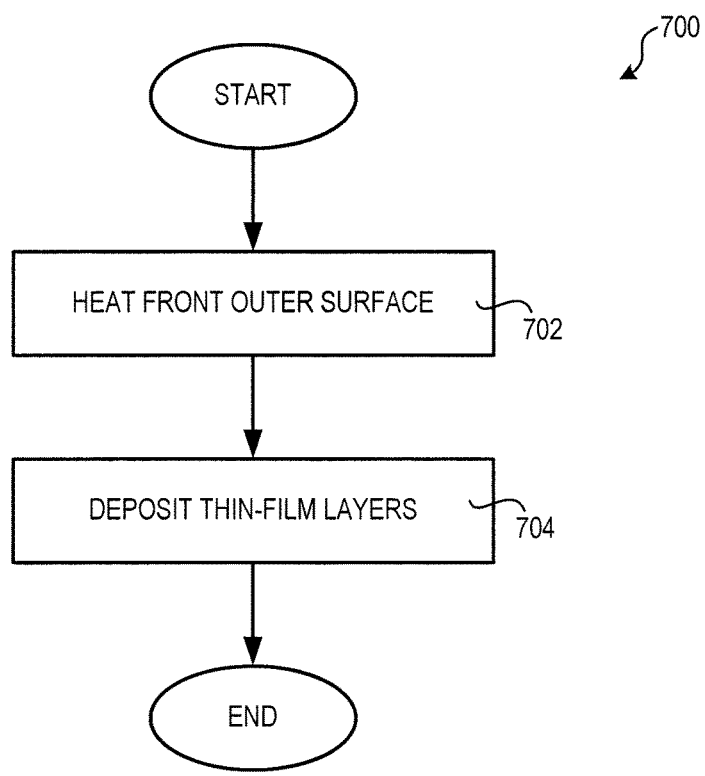
FIG. 7 illustrates a method for depositing one or more thin-film layers on a flexible polyimide substrate, according to an embodiment.

FIG. 7 illustrates a method 700 for depositing one or more thin-film layers on a flexible polyimide substrate including opposing front and back outer surfaces. Method 700 begins with step 702 of heating the front outer surface of the substrate, such that a temperature of the front outer surface is higher than a temperature of the back outer surface. An example of step 702 is heating front outer surface 512 of substrate 502 using zone boundary heaters 532, such that front outer surface 512 is at a higher temperature than back outer surface 542 (see FIG. 5). In step 704, one or more thin-film layers are deposited on front outer surface 512. An example of step 704 is forming GIGS layer 604 on front outer surface 512 of substrate 502 by reacting Copper, Indium, and Gallium from sources 514, 516, 518, respectively, in the presence of Selenium from manifold 528 at elevated temperature, to form GIGS layer 604 on front outer surface 512 (FIGS. 5 and 6). While steps 702 and 704 are shown as being separate steps, it is anticipated that at least parts of these steps will be conducted concurrently in many embodiments.

Figure 8:
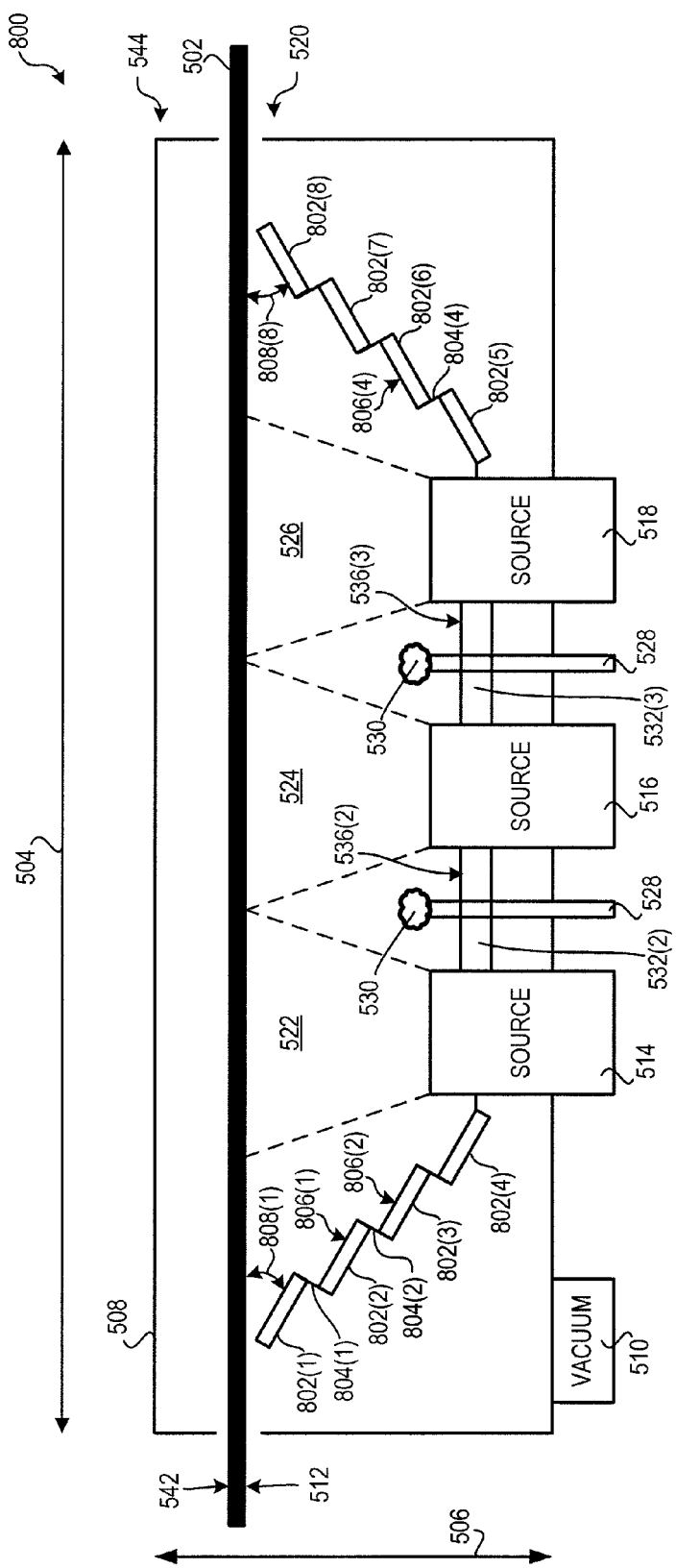
FIG. 8 illustrates one CIGS deposition zone including segmented heaters adapted to radiantly heat a front outer surface of a substrate, according to another embodiment.

FIG. 8 illustrates another GIGS deposition zone 800 adapted to deposit GIGS on flexible, polyimide substrate 502 in a similar fashion to that shown in FIG. 5. Deposition zone 800 is similar to deposition zone 500 of FIG. 5, but with several zone boundary heaters 532 replaced with segmented zone boundary heaters 802. Segmented zone boundary heaters 802 are aligned in such a way as to enable uniform heating while increasing the view factor towards substrate 502, thereby increasing the efficiency by which thermal energy is transferred from heaters 802 to the substrate, with minimal impact upon the zone length 504. Shields 804 are optionally disposed in spaces between adjacent heaters 802 to contain selenium vapor 530, and/or other deposition elements, in zone 800. Shields 804 are optionally fabricated to accommodate electrical and/or optical pass-throughs to accommodate non-contact means for monitoring CIGS deposition in zone 800. Each zone boundary heater 802 has a respective outer heating surface 806 adapted to emit infrared radiation for radiant heating. Heaters 802 are disposed such that each outer heating surface 806 is in line of sight with at least part of substrate outer surface 512. Each heater 802 is disposed such that its outer heating surface 806 is angularly displaced from substrate front outer surface 512 by a respective angle 808 that is less than ninety degrees, such as forty-five degrees. Such placement of heaters 802 results in their respective heating surfaces 806 having a higher view factor to substrate outer surface 512 than would be achieved if the heaters were disposed with their heating surfaces perpendicular to outer surface 512. Only some instances of shields 804, outer heating surfaces 806, and angles 808 are labeled in FIG. 8 to promote illustrative clarity.

Although the systems and methods disclosed herein are discussed in the context of CIS/CIGS deposition, they could also be applied to high temperature deposition of other materials, such as high temperature deposition of high-speed crystalline thin-film transistors for flexible displays and/or for flexible electronics. Additionally, the systems and methods disclosed herein are not limited to use with polyimide substrates, or even polymers with additives and fillers, but are also applicable to other temperature sensitive substrates with low thermal conductivity, such as thin, flexible glass and possibly insulated metallic foils. These substrates may possess higher temperature limits than polyimide, but can exhibit a combination of sensitivity to temperature and structural integrity that can also benefit from the disclosed systems and methods.

Combinations of Features

Features described above as well as those claimed below may be combined in various ways without departing from the scope hereof. The following examples illustrate some possible combinations:

(A1) A method for depositing one or more thin-film layers on a flexible polyimide substrate having opposing front and back outer surfaces may include the following steps: (a) heating the flexible polyimide substrate such that a temperature of the front outer surface of the flexible polyimide substrate is higher than a temperature of the back outer surface of the flexible polyimide substrate; and (b) depositing the one or more thin-film layers on the front outer surface of the flexible polyimide substrate.

(A2) In the method denoted as (A1), the step of heating may include radiantly heating the front outer surface of the flexible polyimide substrate using one or more radiant heat generating elements, where each of the one or more radiant heat generating elements is at least partially in line of sight with the front outer surface of the flexible polyimide substrate.

(A3) In the method denoted as (A2), the one or more radiant heat generating elements may include electric radiant heaters.

(A4) Any of the methods denoted as (A1) through (A3) may further include maintaining a vacuum around the flexible polyimide substrate during the steps of heating and depositing.

(A5) In any of the methods denoted as (A1) through (A4), the step of depositing may include depositing a material selected from the group consisting of Copper-Indium-DiSelenide and an alloy of Copper-Indium-DiSelenide on the front outer surface of the flexible polyimide substrate.

(A6) In any of the methods denoted as (A1) through (A5), the step of depositing may include reacting at least Copper and/or Indium in the presence of Selenium.

(A7) Any of the methods denoted as (A1) through (A6) may further include depositing an oxide layer on the back outer surface of the flexible polyimide substrate.

(B1) A deposition zone for depositing a material on a substrate, where the substrate has a first outer surface of depth by width, may include the following: (a) one or more physical vapor deposition sources adapted to deposit one or more metallic materials on the first outer surface of the substrate; and (b) one or more radiant zone boundary heaters. Each radiant zone boundary heater may include an outer heating surface adapted to emit infrared radiation, and at least one outer heating surface may be angularly displaced from the first outer surface of the substrate by an angle of less than ninety degrees. Each outer heating surface may be in line of sight with at least part of the first outer surface of the substrate.

(B2) In the deposition zone denoted as (B1), at least one of the one or more radiant zone boundary heaters may include an outer heating surface disposed in the length and width directions.

(B3) In either of the deposition zones denoted as (B1) or (B2), the one or more radiant zone boundary heaters may include an electric radiant heater.

(B4) Any of the deposition zones denoted as (B1) through (B3) may further include an enclosure and a vacuum pump adapted to maintain a vacuum in the deposition zone.

(B5) In any of the deposition zones denoted as (B1) through (B4), the one or more physical vapor deposition sources may be adapted to deposit at least one material selected from the group consisting of Copper, Gallium, and Indium, on the first outer surface of the substrate.

(B6) Any of the deposition zones denoted as (B1) through (B5) may further include a Selenium manifold adapted to provide Selenium vapor to the deposition zone.

(B7) In any of the deposition zones denoted as (B1) through (B6), the one or more physical vapor deposition sources may be adapted to deposit at least Copper, Gallium, and Indium on the first outer surface of the substrate.

(B8) In any of the deposition zones denoted as (B1) through (B7), the one or more radiant zone boundary heaters may include a plurality of radiant heaters separated from each other.

(B9) In the deposition zone denoted as (B8), the plurality of radiant heaters separated from each other may include a first and second radiant heater, and the deposition zone may further include a shield disposed between the first and second radiant heaters, where the shield is adapted to contain one or more deposition elements in the deposition zone.

(B10) In any of the deposition zones denoted as (B1) through (B7), the one or more radiant zone boundary heaters may be a single radiant heater.

Changes may be made in the above methods and systems without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present method and system, which, as a matter of language, might be said to fall there between.

What is claimed is:

1. A method for depositing one or more thin-film layers on a flexible polyimide substrate having opposing front and back outer surfaces, the method comprising the steps of:

heating at least the front outer surface of the flexible polyimide substrate, using one or more radiant heat generating elements disposed on a front side of the flexible polyimide substrate, such that a temperature of the front outer surface of the flexible polyimide substrate is higher than a temperature of the back outer surface of the flexible polyimide substrate; and depositing the one or more thin-film layers on the front outer surface of the flexible polyimide substrate, using one or more deposition sources disposed on the front side of the flexible polyimide substrate, the one or more deposition sources being separate from the one or more radiant heat generating elements.

2. The method of claim 1, each of the one or more radiant heat generating elements being at least partially in line of sight with the front outer surface of the flexible polyimide substrate.

3. The method of claim 2, the one or more radiant heat generating elements comprising electric radiant heaters.

4. The method of claim 3, further comprising maintaining a vacuum around the flexible polyimide substrate during the steps of heating and depositing.

5. The method of claim 4, the step of depositing comprising depositing a material selected from the group consisting of Copper-Indium-DiSelenide and an alloy of Copper-Indium-DiSelenide on the front outer surface of the flexible polyimide substrate.

6. The method of claim 5, the step of depositing comprising reacting at least Copper and Indium in the presence of Selenium.

7. A method for depositing one or more thin-film layers on a flexible polyimide substrate having opposing front and back outer surfaces, the method comprising the steps of:
  depositing an oxide layer on the back outer surface of the flexible polyimide substrate;
  heating at least the front outer surface of the flexible polyimide substrate such that a temperature of the front outer surface of the flexible polyimide substrate is higher than a temperature of the back outer surface of the flexible polyimide substrate;
  depositing the one or more thin-film layers on the front outer surface of the flexible polyimide substrate; and
  maintaining a vacuum around the flexible polyimide substrate during the steps of heating and depositing;
  the step of heating comprising radiantly heating the front outer surface of the flexible polyimide substrate using one or more radiant heat generating elements, each of the one or more radiant heat generating elements being at least partially in line of sight with the front outer surface of the flexible polyimide substrate, the one or more radiant heat generating elements comprising electric radiant heaters,
  the step of depositing comprising (a) depositing a material selected from the group consisting of Copper-Indium-DiSelenide and an alloy of Copper-Indium-DiSelenide on the front outer surface of the flexible polyimide substrate and (b) reacting at least Copper and Indium in the presence of Selenium.

8. A method for depositing one or more thin-film layers on a flexible polyimide substrate having opposing front and back outer surfaces, the method comprising the steps of:
  heating at least the front outer surface of the flexible polyimide substrate, using one or more radiant heat generating elements disposed on a front side of the flexible polyimide substrate, such that a temperature of the front outer surface of the flexible polyimide substrate is higher than a temperature of the back outer surface of the flexible polyimide substrate;
  depositing the one or more thin-film layers on the front outer surface of the flexible polyimide substrate, using one or more deposition sources disposed on the front side of the flexible polyimide substrate, the one or more deposition sources being separate from the one or more radiant heat generating elements; and
  allowing radiant transfer of heat away from the flexible polyimide substrate via the back outer surface of the flexible polyimide substrate.

9. The method of claim 8, further comprising depositing a high emittance coating on the back outer surface of the polyimide substrate.

10. The method of claim 9, the high emittance coating being selected from the group consisting of a transparent oxide and an optically-transparent nitride.

11. The method of claim 8, each of the one or more radiant heat generating elements being at least partially in line of sight with the front outer surface of the flexible polyimide substrate.

12. The method of claim 11, the one or more radiant heat generating elements comprising electric radiant heaters.

13. The method of claim 12, further comprising maintaining a vacuum around the flexible polyimide substrate during the steps of heating and depositing.

14. The method of claim 13, the step of depositing comprising depositing a material selected from the group consisting of Copper-Indium-DiSelenide and an alloy of Copper-Indium-DiSelenide on the front outer surface of the flexible polyimide substrate.

15. The method of claim 14, the step of depositing comprising reacting at least Copper and Indium in the presence of Selenium.

* * * * *